United States Patent
Zhang

(10) Patent No.: US 10,825,749 B2
(45) Date of Patent: Nov. 3, 2020

(54) DISPLAY PANEL AND DISPLAY APPARATUS

(71) Applicants: BOE TECHNOLOGY GROUP CO., LTD., Beijing (CN); ORDOS YUANSHENG OPTOELECTRONICS CO., LTD., Ordos, Inner Mongolia (CN)

(72) Inventor: Bo Zhang, Beijing (CN)

(73) Assignees: BOE TECHNOLOGY GROUP CO., LTD., Beijing (CN); ORDOS YUANSHENG OPTOELECTRONICS CO., LTD., Ordos Inner Mongolia (CN)

(*) Notice: Subject to any disclaimer, the term of this patent is extended or adjusted under 35 U.S.C. 154(b) by 48 days.

(21) Appl. No.: 16/301,911

(22) PCT Filed: Mar. 23, 2018

(86) PCT No.: PCT/CN2018/080179
§ 371 (c)(1),
(2) Date: Nov. 15, 2018

(87) PCT Pub. No.: WO2018/214634
PCT Pub. Date: Nov. 29, 2018

(65) Prior Publication Data
US 2019/0198408 A1 Jun. 27, 2019

(30) Foreign Application Priority Data
May 22, 2017 (CN) .......................... 2017 1 0363929

(51) Int. Cl.
*H01L 23/10* (2006.01)
*H01L 27/12* (2006.01)
(Continued)

(52) U.S. Cl.
CPC ............ *H01L 23/10* (2013.01); *H01L 23/564* (2013.01); *H01L 27/1218* (2013.01);
(Continued)

(58) Field of Classification Search
None
See application file for complete search history.

(56) References Cited

U.S. PATENT DOCUMENTS

| | | | | |
|---|---|---|---|---|
| 2011/0287203 | A1* | 11/2011 | Victor | B29C 37/0053 428/36.9 |
| 2014/0061612 | A1* | 3/2014 | Yamazaki | H01L 51/5243 257/40 |
| 2015/0236297 | A1* | 8/2015 | Hong | H01L 51/5246 257/40 |

FOREIGN PATENT DOCUMENTS

| CN | 105572941 A | 5/2016 |
|---|---|---|
| CN | 205789978 U | 12/2016 |

(Continued)

OTHER PUBLICATIONS

Decision of Rejection for CN Application No. 201710363929.4, dated Apr. 3, 2019.
(Continued)

*Primary Examiner* — Mounir S Amer
(74) *Attorney, Agent, or Firm* — Dinsmore & Shohl LLP

(57) ABSTRACT

The present disclosure relates to a display panel and a display apparatus. The display panel comprises a back plate and a cover plate which are oppositely arranged, and at least a portion of a side formed by the back plate and the cover plate is attached with a protective film to seal a corresponding portion of a gap between the back plate and the cover plate.

8 Claims, 3 Drawing Sheets

(51) Int. Cl.
*H01L 23/00* (2006.01)
*H01L 51/52* (2006.01)
*H01L 27/32* (2006.01)

(52) U.S. Cl.
CPC ........ *H01L 51/525* (2013.01); *H01L 27/3244* (2013.01); *H01L 51/5246* (2013.01)

(56) References Cited

FOREIGN PATENT DOCUMENTS

| | | |
|---|---|---|
| CN | 106646998 A | 5/2017 |
| CN | 107195657 A | 9/2017 |
| JP | 2003-059645 A | 2/2003 |

OTHER PUBLICATIONS

First Office Action for CN Application No. 201710363929.4, dated Jun. 28, 2018.
International Search Report and Written Opinion for PCT/CN2018/080179, dated Jun. 26, 2018.
Second Office Action for CN Application No. 201710363929.4, dated Nov. 23, 2018.

\* cited by examiner

DISPLAY PANEL AND DISPLAY APPARATUS

CROSS REFERENCE TO RELATED APPLICATIONS

The present application is a U.S. National Stage Application under 35 U.S.C. § 371, of International Patent Application No. PCT/CN2018/080179, filed on Mar. 23, 2018, which claims priority to Chinese Patent Application No. 201710363929.4, filed May 22, 2017, the entire disclosure of both of which are incorporated herein by reference.

TECHNICAL FIELD

The present disclosure relates to a display panel and a display apparatus.

BACKGROUND

In recent years, the Organic Light-Emitting Diode (OLED) becomes an emerging flat display product that is very hot at home and abroad. Current OLED display panels have typically a rigid structure, wherein the Thin Film Transistor (TFT) circuit is made on a back plate glass and is packaged with a Frit and a packaging cover plate glass. During printing, the Frit is spaced a gap from an edge of the TFT back plate glass and the packaging cover plate glass and cannot be overspread on metal lines which are made on the TFT back plate glass, and a portion of the metal lines are exposed from the Frit. When an antistatic ability test is carried out for the OLED display panel, Electro-Static discharge (ESD) easily takes place on the metal lines along the gap between the TFT back plate glass and the packaging cover plate glass, and even static electricity is guided into the interior of the panel to burn out the TFT circuit, thus resulting in an abnormal display of the OLED display panel.

SUMMARY

The present disclosure discloses a display panel, wherein the display panel comprises a back plate and a cover plate which are oppositely arranged, and at least a portion of a side formed by the back plate and the cover plate is attached with a protective film to seal a corresponding portion of a gap between the back plate and the cover plate.

Alternatively, one end surface of the protective film is flush with an outer surface of the cover plate, and the other end surface of the protective film is flush with an outer surface of the back plate.

Alternatively, a material of the protective film is a soft material which is insulated and waterproof.

Alternatively, the protective film is a Polyethylene terephthalate (PET) film. Alternatively, a thickness between both ends of the protective film is 0.5 mm to 0.6 mm.

Alternatively, the display panel further comprises a Thin Film Transistor (TFT) circuit arranged on the back plate, wherein the cover plate is adhered to the TFT circuit by the Frit.

Alternatively, the display panel further comprises a panel glass, wherein the panel glass is attached to the cover plate.

To solve the aforementioned problem, the present disclosure further discloses a display apparatus, the display apparatus comprising the aforementioned display panel.

DESCRIPTIONS OF DRAWINGS

DETAILED DESCRIPTION

To make the aforementioned objective, features and advantages of the present disclosure more obvious and comprehensive, a further explanation is made in detail for the present disclosure in combination with the drawings and the embodiments.

Figure 1:
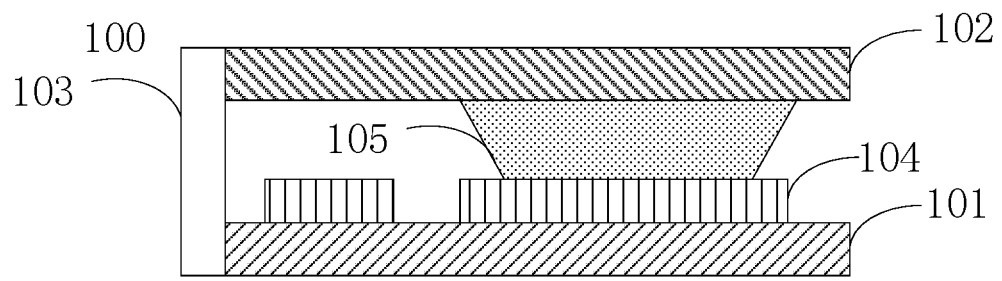
FIG. 1 illustrates a cross-sectional schematic diagram of the display panel according to some embodiments of the present disclosure.

FIG. 1 illustrates a cross-sectional schematic diagram of a display panel 100 according to some embodiments of the present disclosure. As shown in FIG. 1, the display panel 100 may comprise a back plate 101 and a cover plate 102 which are oppositely arranged, and at least a portion of a periphery or a side formed by the back plate 101 and the cover plate 102 is attached with a protective film 103 to seal a corresponding portion of a gap between the back plate 101 and the cover plate 102.

FIG. 1 only illustrates that a left portion of the periphery or the side formed by the back plate 101 and the cover plate 102 is attached with a protective film 103 to seal the corresponding portion of the gap between the back plate 101 and the cover plate 102. However, those skilled in the art can understand that, more portions or even all portions of the periphery or the side formed by the back plate 101 and the cover plate 102 may be attached with a protective film 103 to seal the corresponding portion of the gap between the back plate 101 and the cover plate 102.

For example, in some embodiments, the periphery or the side formed by the back plate 101 and the cover plate 102 includes a circuit connection side and a package side, wherein only the package side is attached with the protective film 103 to seal the corresponding portion of the gap between the back plate 101 and the cover plate 102.

Figure 2:
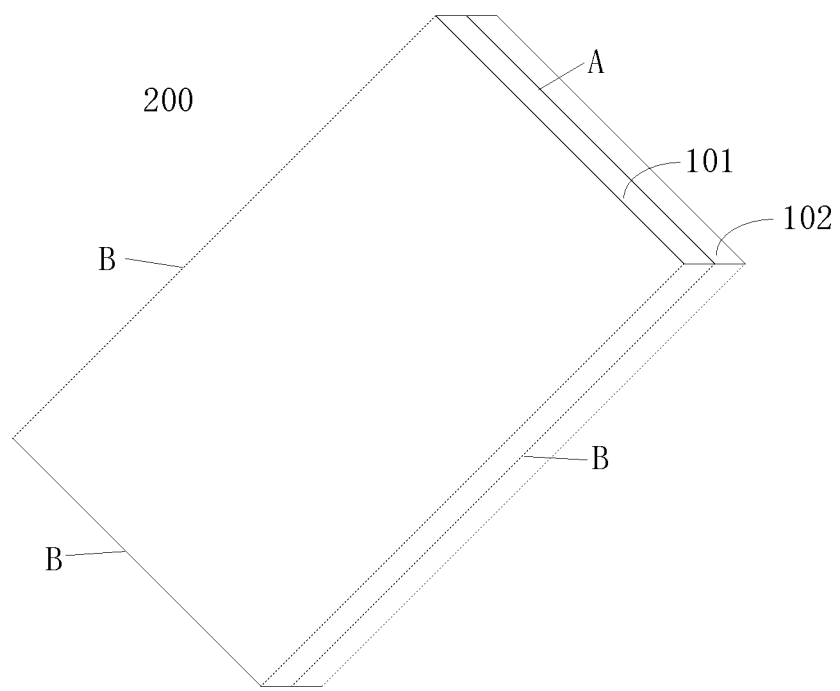
FIG. 2 illustrates an exemplary perspective schematic diagram of the display panel according to some embodiments of the present disclosure.

FIG. 2 illustrates an exemplary perspective schematic diagram of a display panel 200 according to some embodiments of the present disclosure. As shown in FIG. 2, the periphery or the side formed by the back plate 101 and the cover plate 102 may include three package sides B and one circuit connection side A. As described above, all the package sides B may be attached with the protective film 103 which seals the corresponding portion of the gap between the back plate 101 and the cover plate 102, such that static electricity cannot be discharged from the gap between the back plate 101 and the cover plate 102 to a circuit 104 of the display panel, thus improving an antistatic ability of the display panel.

Those skilled in the art may understand that, the arrangement of the package side and the circuit connection side may be adjusted according to actual needs.

In some embodiments of the present disclosure, one end surface of the protective film 103 is flush with an outer surface of the cover plate 101, and the other end surface of the protective film 103 is flush with an outer surface of the back plate 102. For example, as shown in FIG. 1, both the upper and lower ends of the protective film 103 are flush with the outer surface of the cover plate 101 and the outer surface of the back plate 102, respectively.

If the protective film 103 forms projections on the outer surfaces of the cover plate 102 and the back plate 102, when the display panel is attached with other parts, the projections formed by the protective film 103 may possibly affect a tightness degree of attachment of the other parts, which results in a situation of an untight attachment. In the present embodiment, with reference to the cross-sectional schematic diagram of the display panel as shown in FIG. 1, both ends of the protective film 103 are flush with the outer surfaces of the cover plate 102 and the back plate 101, and no projections will be formed on the outer surfaces of the cover plate 102 and the back plate 101. Accordingly, a tight attachment may be implemented when the other parts are attached.

In some embodiments of the present disclosure, a material of the protective film 103 is a soft material which is insulated and waterproof. The insulating material may prevent static electricity from being discharged from the gap between the back plate 101 and the cover plate 102 to the circuit of the display panel, and improve an antistatic ability of the display panel. The waterproof material may prevent water from entering the gap between the back plate 101 and the cover plate 102, and avoid a failure of the display panel due to water entrance. The soft material may protect the sides of the back plate 101 and the cover plate 102 when the display panel collides with a metal frame, prevent the back plate 101 and the cover plate 102 from being damaged, and improve a mechanical strength of the display panel.

In some embodiments of the present disclosure, the protective film 103 is a Polyethylene terephthalate (PET) film. The PET film has many advantages as follows: it has excellent physical mechanical properties in a broad temperature range, a long-term service temperature up to 120° C., and a good creep resistance, fatigue durability, abrasion resistance, dimensional stability at a high temperature and a high frequency; it has an excellent electrical insulation; it has a low permeability of gas and water vapor, excellent properties of resistance to gas, water, oil, and odor; it has an impact resistance strength which is 3 to 5 times that of other films, a good folding endurance, and excellent mechanical properties. Therefore, the PET film is a preferable soft material which is insulated and waterproof.

In some embodiments of the present disclosure, a thickness between both ends of the protective film 103 may be, for example, 0.5 mm to 0.6 mm. The thickness of the protective film 103 is determined by thicknesses of the back plate 102, the cover plate 102 and the gap between the back plate 101 and the cover plate 102, and is 0.5 mm to 0.6 mm under normal circumstances.

In some embodiments of the present disclosure, the display panel further comprises a Thin Film Transistor (TFT) circuit 104 arranged on the back plate 102, and the cover plate 102 is adhered to the TFT circuit 104 by a Frit 105. The Frit has a strong ability of resistance to water and oxygen. By means of adhering the cover plate 102 to the TFT circuit 104 by a Frit 105, the package process is simple and is easily implemented, and it is possible to protect most Thin Film Transistor (TFT) circuits of the display panel.

Figure 3:
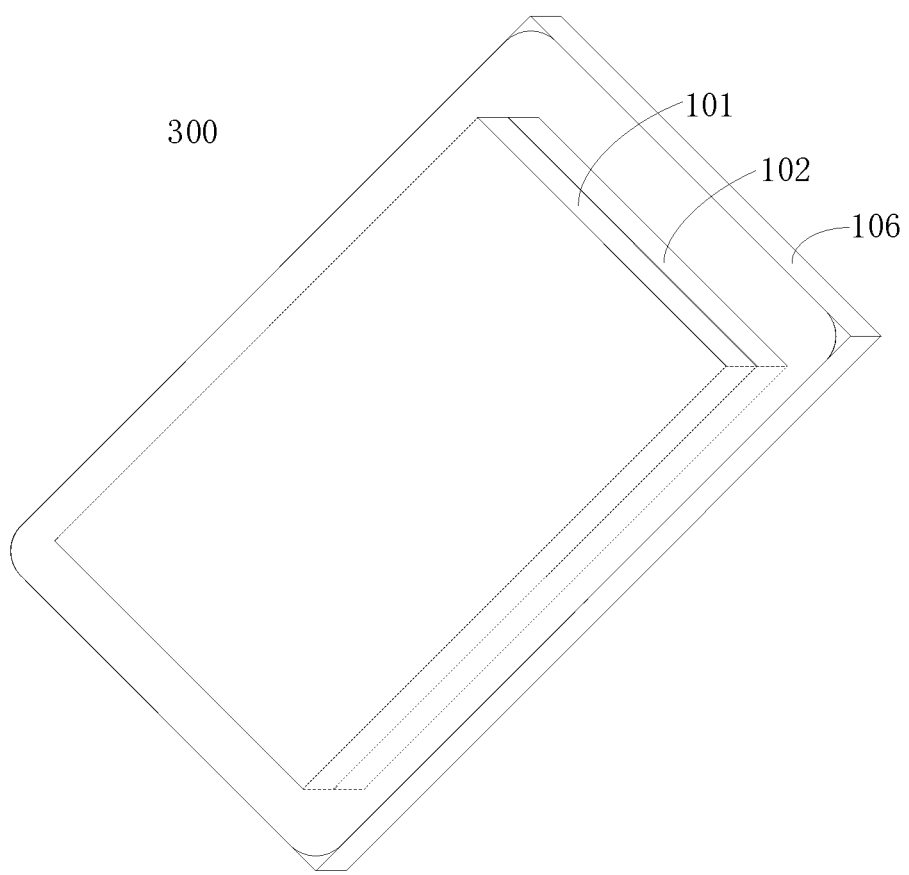
FIG. 3 illustrates an exemplary perspective schematic diagram of the display panel according to some embodiments of the present disclosure.

FIG. 3 illustrates an exemplary perspective schematic diagram of a display panel 300 according to some embodiments of the present disclosure. As shown in FIG. 3, it is different from the display panels 100 and 200 as shown in FIGS. 1 and 2 in that, the display panel 300 further includes a panel glass 106 which is attached to the cover plate 102.

Referring to the perspective schematic diagram of the display panel as illustrated in FIG. 3, the panel glass 106 is attached to the cover plate 102 to protect the cover plate 102. The protective film 103 may be attached after the panel glass 106 is attached to the cover plate 102, which avoids an untight attachment of the panel glass 106 and the cover plate 102 caused by the prior attachment of the protective film 103.

To sum up, in embodiments of the present disclosure, at least a portion of the side of the display panel is attached with the protective film to seal the gap between the back plate and the cover plate, such that static electricity cannot be discharged from the gap between the back plate and the cover plate to the Thin Film Transistor (TFT) circuit of the display panel, thus improving an antistatic ability of the display panel.

Further, the protective film protects the side of the cover plate and the back plate, such that the display panel is not easily damaged when colliding with the metal frame, and a mechanical strength of the display panel is improved.

Figure 4:
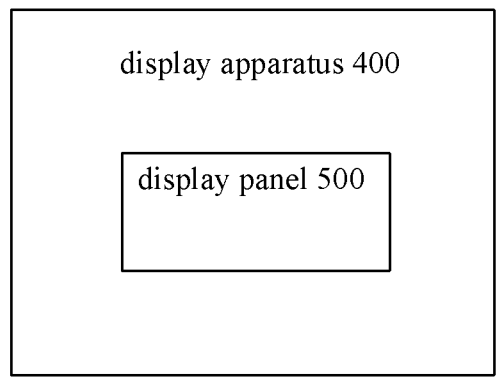
FIG. 4 illustrates an exemplary structural diagram of the display apparatus according to some embodiments of the present disclosure.

FIG. 4 illustrates an exemplary structural diagram of a display apparatus 400 according to some embodiments of the present disclosure. As shown in FIG. 4, the display apparatus 400 comprises the aforementioned display panel 500 according to the embodiment of the present disclosure. The display panel 500 is, for example, the display panel 100, 200 or 300 as shown in FIGS. 1-3.

The display panel 400 may include, but not limited to, liquid crystal panel, electronic paper, OLED panel, mobile phone, tablet computer, TV set, display, laptop, digital photo frame, navigator, and any other product or part having a display function.

To sum up, at least a portion of the side of the display panel according to the embodiment of the present disclosure is attached with the protective film to seal the gap between the back plate and the cover plate, such that static electricity cannot be discharged from the gap between the back plate and the cover plate to the circuit of the display panel, thus improving an antistatic ability of the display panel.

In some embodiments, the protective film protects the side of the cover plate and the back plate, such that the display panel is not easily damaged when colliding with the metal frame, and a mechanical strength of the display panel is improved.

The various embodiments in the present specification are described in a progressive manner, and each embodiment focuses on differences from other embodiments, and the same or similar parts between the various embodiments can be referred to each other.

Finally, it should also be noted that in this context, relational terms such as first and second are used merely to distinguish one entity or operation from another entity or operation, and do not necessarily require or imply there is any such actual relationship or order between these entities or operations. Furthermore, the terms "comprise," "include" or any other variant is intent to cover a non-exclusive meaning, such that a process, method, product, or equipment including a series of elements includes not only those elements but also other elements which are not clearly listed or elements which are inherent to such process, method, product, or equipment. Without a further limitation, an element that is defined by the phrase "comprising a . . . " does not exclude the presence of additional same elements in the process, method, product or equipment which includes the elements.

The display panel and the display apparatus provided by the present disclosure are described in detail. The principles and implementations of the present disclosure are described herein by using specific examples. The description of the above embodiments is only for helping to understand the method and core idea of the present disclosure. At the same time, for those skilled in the art, there will be changes in the specific embodiments and application scopes according to the concept of the present disclosure. To sum up, the contents of the present specification should not be construed as being a limit to the present disclosure.

What is claimed is:

1. A display panel, wherein the display panel comprises a back plate and a cover plate which are oppositely arranged, and at least a portion of a side formed by the back plate and the cover plate is attached with a protective film to seal a corresponding portion of a gap between the back plate and the cover plate,
    wherein the display panel further comprises a Thin Film Transistor (TFT) circuit arranged on the back plate, wherein the cover plate is adhered to the TFT circuit by a frit;
    wherein the side formed by the back plate and the cover plate comprises a circuit connection side and a package side, wherein only the package side is attached with the protective film to seal the corresponding portion of the gap between the back plate and the cover plate, such that static electricity cannot be discharged from the gap between the back plate and the cover plate to the TFT circuit of the display panel, thus improving an antistatic ability of the display panel;
    wherein the protective film forms no projections on an outer surface of the cover plate and the back plate such that a tight attachment is implemented when other parts are attached;
    wherein a material of the protective film is a soft material which is insulated and waterproof and the protective film is different from the frit, wherein the protective film which is waterproof prevents water from entering the gap between the back plate and the cover plate, and avoids a failure of the display panel due to water entrance, and wherein the protective film of the soft material protects the side formed by the back plate and the cover plate when the display panel collides with a metal frame, prevents the back plate and the cover plate from being damaged, and improves a mechanical strength of the display panel;
    wherein a thickness between both ends of the protective film is determined by thicknesses of the back plate, the cover plate and the gap between the back plate and the cover plate; and
    wherein the display panel further comprises a panel glass, wherein the protective film is attached after the panel glass is attached to the cover plate, such that an untight attachment of the panel glass and the cover plate caused by a prior attachment of the protective film is avoided.

2. The display panel according to claim 1, wherein one end surface of the protective film is flush with the outer surface of the cover plate, and the other end surface of the protective film is flush with the outer surface of the back plate.

3. The display panel according to claim 1, wherein the protective film is a Polyethylene terephthalate (PET) film.

4. The display panel according to claim 1, wherein the thickness between both the ends of the protective film is 0.5 mm to 0.6 mm.

5. A display apparatus, wherein the display apparatus comprises a display panel, wherein the display panel comprises a back plate and a cover plate which are oppositely arranged, and at least a portion of a side formed by the back plate and the cover plate is attached with a protective film to seal a corresponding portion of a gap between the back plate and the cover plate,
    wherein the display panel further comprises a Thin Film Transistor (TFT) circuit arranged on the back plate, wherein the cover plate is adhered to the TFT circuit by a frit;
    wherein the side formed by the back plate and the cover plate comprises a circuit connection side and a package side, wherein only the package side is attached with the protective film to seal the corresponding portion of the gap between the back plate and the cover plate, such that static electricity cannot be discharged from the gap between the back plate and the cover plate to the TFT circuit of the display panel, thus improving an antistatic ability of the display panel;
    wherein the protective film forms no projections on an outer surface of the cover plate and the back plate such that a tight attachment is implemented when other parts are attached;
    wherein a material of the protective film is a soft material which is insulated and waterproof and the protective film is different from the frit, wherein the protective film which is waterproof prevents water from entering the gap between the back plate and the cover plate, and avoids a failure of the display panel due to water entrance, and wherein the protective film of the soft material protects the side formed by the back plate and the cover plate when the display panel collides with a metal frame, prevents the back plate and the cover plate from being damaged, and improves a mechanical strength of the display panel;
    wherein a thickness between both ends of the protective film is determined by thicknesses of the back plate, the cover plate and the gap between the back plate and the cover plate; and
    wherein the display panel further comprises a panel glass, wherein the protective film is attached after the panel glass is attached to the cover plate, such that an untight attachment of the panel glass and the cover plate caused by a prior attachment of the protective film is avoided.

6. The display apparatus according to claim 5, wherein one end surface of the protective film is flush with the outer surface of the cover plate, and the other end surface of the protective film is flush with the outer surface of the back plate.

7. The display apparatus according to claim 5, wherein the protective film is a Polyethylene terephthalate (PET) film.

8. The display apparatus according to claim 5, wherein the thickness between both the ends of the protective film is 0.5 mm to 0.6 mm.

* * * * *